(12) United States Patent
Aikiyo

(10) Patent No.: US 6,385,222 B1
(45) Date of Patent: May 7, 2002

(54) SEMICONDUCTOR LASER MODULE, AND METHOD FOR DRIVING THE SEMICONDUCTOR LASER MODULE

(75) Inventor: Takeshi Aikiyo, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/443,322

(22) Filed: Nov. 19, 1999

(30) Foreign Application Priority Data

Nov. 19, 1998 (JP) .......................................... 10-330014

(51) Int. Cl.$^7$ ................................................ H01S 3/10
(52) U.S. Cl. .................................................... 372/38.02
(58) Field of Search .......................... 372/34, 36, 38.1, 372/38.02

(56) References Cited

U.S. PATENT DOCUMENTS

| | | | | |
|---|---|---|---|---|
| 5,118,964 A | * | 6/1992 | McArdle | ..................... 307/117 |
| 5,245,499 A | | 9/1993 | Senes | |
| 5,515,682 A | | 5/1996 | Nagakubo et al. | ............ 62/3.7 |
| 5,646,763 A | * | 7/1997 | Misaizu et al. | ............. 359/187 |
| 5,845,031 A | | 12/1998 | Aoki | ........................... 385/92 |

FOREIGN PATENT DOCUMENTS

| | | |
|---|---|---|
| JP | 52-61982 | 5/1977 |
| JP | 62-149858 | 9/1987 |
| JP | 2-15762 | 1/1990 |
| JP | 2-47077 | 3/1990 |
| JP | 02305485 | 12/1990 |
| JP | 07022181 | 1/1995 |
| JP | 8-213688 | 8/1996 |
| JP | 09064450 | 3/1997 |
| JP | 11-126939 | 5/1999 |
| JP | 11251675 | 9/1999 |
| JP | 11289045 | 10/1999 |
| JP | 2000216474 | 8/2000 |

* cited by examiner

Primary Examiner—James W. Davie
(74) Attorney, Agent, or Firm—Lacasse & Associates

(57) ABSTRACT

The present invention relates to a semiconductor laser module and a method for driving the same, wherein an overcurrent limiting means which suppresses the overcurrent to the thermomodule is provided, and it is possible to prevent abnormally high temperature heat being generated from the thermomodule, originating from the overcurrent flow in the heating direction to the thermomodule. Therefore, it is possible to avoid various problems which include thermal breakage of the thermomodule itself, thermal breakage of components such as semiconductor laser elements, etc., thermally connected to the thermomodule, a slip in optical coupling due to a positional deviation of the components originating from high temperature heat, an optical coupling loss, etc. Therefore, the reliability of optical coupling and durability of the semiconductor laser module can be further improved.

16 Claims, 6 Drawing Sheets

SEMICONDUCTOR LASER MODULE, AND METHOD FOR DRIVING THE SEMICONDUCTOR LASER MODULE

FIELD OF THE INVENTION

The present invention relates to a semiconductor module used in the field of optical transmissions and a method for driving the semiconductor laser module.

BACKGROUND OF THE INVENTION

FIG. 6A exemplary shows one structural example of a semiconductor laser module, using a cross-sectional view, and FIG. 6B shows one example of electric wiring of the semiconductor laser module illustrated in FIG. 6A. The semiconductor laser module 1 illustrated in FIG. 6A is made into a module in which a semiconductor laser element 2 and an optical fiber 3 are optically coupled to each other.

That is, as shown in FIG. 6A, a thermomodule 5 is fixed on the wall surface of the inner bottom of a package 4. The thermomodule 5 is constructed so that a plurality of Peltier elements 5a are placed between plate members 5b and 5c (first substrate and second substrate) of a high temperature conductive body (for example aluminum nitride). In this example, the plate member 5b is fixed on the wall surface of the inner bottom 4a of the package 4, and the heat radiating side of the Peltier elements 5a is installed on the plate member 5b by soldering while the plate member 5c is fixed at the heat absorbing side of the Peltier elements 5a by soldering.

In such a thermomodule 5, a heating generating action (heating action) and a heat-absorbing action (cooling action) are changed in compliance with the orientation of a current flowing into the Peltier elements 5a, and the heat generating amount and heat absorbing amount thereof are changed in compliance with a current flow amount into the Peltier elements 5a.

On the upper side (that is, on the plate member 5c) of such a thermomodule 5, a substrate 6 for attaching components is installed and fixed by soldering (for example, InPbAg eutectic solder (Melting point: 148° C.). Supporting members 7 and 8, and a lens 9 are fixed on the substrate 6. A semiconductor laser element 2 is disposed at the supporting member 7, and at the same time a thermistor 10, which detects the temperature of the semiconductor laser element 2, is disposed there at. Also, a monitor photodiode 11 for monitoring the light emitting state of the semiconductor laser element 2 is provided on the supporting member 8. As the semiconductor laser element 2, those having a signal light wavelength band of, for example, a 131 nm band and 1550 nm band, or those having a wavelength band of a pumping light of an optical fiber amplifier of a 1480 nm band and 980 nm band, etc., are generally used.

A through hole 4c is formed at the side wall 4b of the package 4, into which an optical fiber supporting member 12 is inserted and fitted. The optical fiber supporting member 12 has an inserting hole 12a, wherein the end portion side of an optical fiber 3 is led from the outside of the package 4 into the interior of the inserting hole 12a. In addition, a lens 14 is disposed in the inserting hole 12a with spacing from the tip end of the optical fiber 3.

As shown in FIG. 6B, a plurality of lead pins 16 (in the example shown in FIG. 6B, 14 lead pins) are formed so as to protrude outward at the package 4. Also, conductive patterns and conducting means 17, which electrically connect the semiconductor laser element 2, thermomodule 5, thermistor 10, and photodiode 11 to the corresponding lead pins 16, are provided in the interior of the package 4. By these conductive means 17 and lead pins 16, the semiconductor element 2, thermomodule 4, thermistor 10, and photodiode 11 can be, respectively, electrically connected to an external drive controlling means (not illustrated) for driving a semiconductor laser module.

In detail, in the example shown in FIG. 6B, the semiconductor element 2 is electrically connected to the drive controlling means by the conducting means 17 and lead pins 16(16g, 16h), the thermomodule 5 is electrically connected thereto by the conducting means 17 and lead pins 16 (16a and 16f), and further the thermistor 10 is electrically connected thereto by the conducting means 17 and lead pins 16(16b and 16e).

The semiconductor laser module 1 shown in FIG. 6A and FIG. 6B is constructed as described above. As such a semiconductor laser module 1 is electrically connected to the drive controlling means and an electric current is provided from the drive controlling means to the semiconductor laser element 2 of the semiconductor laser module 1, a laser light is emitted from the semiconductor laser element 2. The emitted laser light is condensed by a coupling optical system consisting of the lenses 9 and 14 and is made incident into an optical fiber 3, whereby the light is caused to propagate in the optical fiber 3 and is used for an appointed application.

However, the intensity and wavelength of the laser light emitted from the abovementioned semiconductor laser element 2 are caused to fluctuate in response to the temperature of the semiconductor laser element 2 itself. For this reason, in order to control the intensity and wavelength of the laser light so as to become constant, the drive controlling means controls, on the basis of output values outputted from the thermistor 10, the orientation and amount of current flows to the thermomodule 5 so that the temperature of the semiconductor laser element 2 becomes constant, whereby the heating action and cooling action of the thermomodule 5 are thus controlled. By the temperature control made by the thermomodule 5, the temperature of the semiconductor laser element 2 can be kept almost constant, whereby the intensity and wavelength of the laser light emitted from the semiconductor laser element 2 can be made constant.

OBJECTS AND SUMMARY OF THE INVENTION

However, for example, there is a case where an abnormal situation arises, in which an overcurrent, in the heating direction, which heats the thermomodule 5 flows into the thermomodule 5 by erroneous operations and/or generation of an overcurrent, etc. In this case, the thermomodule 5 is excessively overheated, whereby such components as the semiconductor laser element 2, substrate 6, lens 9, etc., disposed on the thermomodule 5 are rapidly heated (for example, so that the indication temperature of the thermistor 10 reaches 200° C. in ten seconds).

However, there is a case where the substrate (that is, the plate member 5c) at the side of the thermomodule where components such as the semiconductor laser element 2, etc., are disposed is thermally connected to the side wall of the package 4 or the optical fiber supporting member 12. In this case, a part of the heat transmitted from the thermomodule 5 is discharged to the periphery via the side wall of the package 4 and the optical fiber supporting member 12. Therefore, as described above, where the thermomodule 5 is heated to an abnormally high temperature, a part of the high temperature heat is radiated from the thermomodule 5 to the periphery via the optical fiber supporting member 12. Thereby, the amount of heat transmitted from the thermomodule 5 to the components on the thermomodule 5 can be suppressed, whereby the temperature rise of the components can be reduced.

But, in the example shown in FIG. 6, the plate member 5c of the thermomodule 5 is thermally isolated from the side wall of the package 4 and the optical fiber supporting member 12. Accordingly, there is almost no case where the heat transmitted from the thermomodule 5 is dissipated at the periphery through the side wall of the package 4 and the optical fiber supporting member 12. In such a case, where an abnormally high temperature heating arises at the thermomodule 5, almost all the high temperature heat of the thermomodule 5 is transmitted to and accumulated in the components on the thermomodule 5. Therefore, the temperature rise of the components on the thermomodule 5 becomes remarkable, whereby the following situations are apt to occur, which constitute a problem.

For example, as described above, where the temperature of the semiconductor laser element 2 rises to a high temperature by a high temperature heating of the thermomodule 5, resulting from an overcurrent flow in the heating direction, defects in the crystal of the semiconductor laser element 2 increase. By an increase in the defects, such a problem occurs, by which the characteristics of the semiconductor laser element 2 are deteriorated to a large extent.

Further, the substrate 6 is fixed on the plate member 5c of the thermomodule 5, as described above, by solder (a thermofusion adhesive material) such as, for example, InP-bAg eutectic solder. Accordingly, as described above, where the thermomodule 5 is heated to an abnormally high temperature, the above solder is melted to cause the substrate 6 to be subjected to a positional deviation. By a positional deviation of the substrate 6, the semiconductor laser element 2 and lens 9 are caused to slip from their normal positions. That is, such a problem occurs, by which a degradation in the optical coupling (misalignment) is produced. In this case, the semiconductor laser element 2 and lens 9 move with respect to the optical fiber 3. In particular, if the semiconductor laser element 2 is subjected to a tilt with respect to the optical fiber 3, resulting from the positional deviation of the substrate 6, the optical output is reduced by 95% by, for example, a tilt of 0.2° degrees, and the optical output is degraded to a large extent.

In addition, the abovementioned glass-made lens 9 is adhered to and fixed at, for example, a metallic holder by utilizing a glass solder, and the metallic holder with the lens is fixed at the substrate 6, whereby there is a case where the lens 9 is then fixed at the substrate 6. In this case, when the thermomodule 5 is rapidly heated abnormally, cracks occur at a soldered portion (glass solder) between the abovementioned lens 9 and the metallic holder by a large difference in the thermal expansion ratio between glass and metal. By generation of cracks, the lens 9 comes off from the metallic bolder, and such a problem occurs, where an optical coupling between the semiconductor laser element 2 and optical fiber 3 is damaged.

Further, as described above, Peltier elements 5a and plate members 5b and 5c are bonded by utilizing solder. Accordingly, the solder is melted by abnormal heating of the thermomodule 5, whereby the Peltier elements 5a are caused to come off, thereby causing the thermomodule 5 itself to be damaged.

The invention was developed in order to solve the abovementioned problems and shortcomings, and it is therefore an object of the invention to prevent an overcurrent flow in the heating direction of the thermomodule and to prevent such problems from occurring by the overcurrent flow.

That is, a semiconductor laser module, according to the first aspect of the invention, comprises a semiconductor laser element, a thermomodule for regulating the temperature of the semiconductor laser element, and an optical fiber optically coupled to a laser light emitted from the abovementioned semiconductor laser element, wherein the thermomodule is constructed so that it varies and regulates the temperature of the semiconductor laser element in compliance with the current amount flowing into the corresponding thermomodule and is provided with an overcurrent flow limiting means which suppresses an overcurrent flow into the thermomodule.

A semiconductor laser module, according to the second aspect of the invention, is a semiconductor laser module constructed in compliance with the first aspect, wherein the heating action and cooling action are changed in compliance with the orientation of a passing current, and the overcurrent limiting means is provided in a current channel where a current in the heating direction for heating the thermomodule is caused to flow into the thermomodule.

A semiconductor laser module, according to the third aspect of the invention, is a semiconductor laser module constructed in compliance with the first aspect, wherein a bypass channel which short-circuits the upstream side and downstream side of a thermomodule, bypassing the thermomodule, is provided in a current channel through which a current in the heating direction is caused to flow, a resistor intervenes in the bypass channel, and at the same time, a diode in which the current direction for heating is made into a forward direction is provided in series with the resistor, and wherein the bypass channel and resistor shunt and provide the current in the heating direction to the thermomodule and bypass channel, and constitute an overcurrent limiting means which lightens the flow of the overcurrent of the heating direction into the thermomodule.

A semiconductor laser module, according to the fourth aspect of the invention, is a semiconductor laser module constructed in compliance with the first, second or third aspect, wherein the thermomodule is constructed with Peltier elements placed between the first substrate and the second substrate, a semiconductor laser element is disposed at either the first substrate or the second substrate and is thermally connected with the thermomodule, and the semiconductor laser module has a lens which condenses a laser light emitted from the semiconductor laser element and couples it into an optical fiber, and wherein the lens is thermally connected to a substrate at the side of the thermomodule where a semiconductor laser element is disposed via a thermofusion adhesive material which fixes an attaching member of the lens.

A semiconductor laser module, according to the fifth aspect of the invention, is a semiconductor laser module constructed in compliance with the first, second, or third aspect of the invention, wherein an optical fiber is an optical fiber with a lens, in which a lens for condensing a laser light emitted from the semiconductor laser element is formed at the end portion into which the laser light is made incident.

A semiconductor laser module, according to the sixth aspect of the invention, is a semiconductor laser module constructed by any one of the first through the fifth aspects of the invention, in which a thermomodule is constructed so that Peltier elements are placed between the first substrate and the second substrate, and further having a construction in that the semiconductor laser elements are disposed at either side of the first substrate or the second substrate and are thermally connected to the thermomodule, wherein the semiconductor laser elements and thermomodule are accommodated and disposed in a package, the package is provided with a through hole passing from the interior to the exterior of the package, in which an optical fiber supporting member consisting of a thermally conductive material is inserted and fitted, and the end portion side of an optical fiber is introduced from the exterior to the interior of the package through an insertion hole secured at the optical fiber supporting member, a substrate at the side of the thermomodule where the semiconductor laser elements are disposed is thermally isolated from the optical fiber supporting member, and radiation of heat from the substrate of the thermomodule at the side where the semiconductor laser elements are disposed to the exterior of the package through the optical fiber supporting member is limited.

With the semiconductor laser module according to the first aspect through the sixth aspect of the invention, an overcurrent flow to the thermomodule can be suppressed by an overcurrent limiting means, whereby it is possible to prevent problems resulting from the overcurrent flow.

In particular, in the semiconductor laser module according to the second aspect through the sixth aspect of the invention, it is possible to suppress an overcurrent in the heating direction to the thermomodule by the overcurrent limiting means, and it is possible to prevent various problems resulting from an overcurrent flow in the heating direction to the thermomodule. That is, it is possible to prevent a problem of deterioration in the characteristics of semiconductor laser elements, a problem of optical coupling degradation, a problem of optical coupling loss due to lens come-off, a problem of breakage of the thermomodule, which result from abnormal heating of the thermomodule due to an overcurrent flow to the thermomodule.

Further, in the semiconductor laser module according to the third aspect of the invention, it is possible to suppress an overcurrent flow in the heating direction to the thermomodule with a simple construction in which only a bypass path and a diode are provided.

Further, in the semiconductor laser module according to the sixth aspect of the invention, the thermomodule is thermally isolated from the optical fiber supporting member. Therefore, when an abnormally high temperature heat is emitted, resulting from an overcurrent flow in the heating direction to the thermomodule, the high temperature heat is scarcely dissipated from the thermomodule to the exterior of a package through the optical fiber supporting member.

Accordingly, almost all the abnormally high temperature heat from the thermomodule is transmitted and accumulated in such components as semiconductor laser elements, etc., which are thermally connected to the thermomodule, whereby there is a fear that a rapid temperature rise occurs in the components, and various serious problems may arise. However, in the semiconductor laser module according to the sixth aspect of the invention, since such an overcurrent limiting means as described above is provided, it is possible to prevent the overcurrent flow in the heating direction to the thermomodule, whereby such serious problems can be prevented from occurring, and the overcurrent limiting means is very effective.

A method for driving the semiconductor laser module according to the first aspect of the invention is a method for driving a semiconductor laser module comprising semiconductor laser elements, a thermomodule for adjusting the temperature of the semiconductor laser elements, and optical fibers optically coupled to a laser light emitted from the semiconductor laser elements. The method comprises the steps of: thermally connecting the thermomodule to the semiconductor laser elements; adjusting the temperature of the semiconductor laser elements in compliance with the amount of current which is caused to flow to the corresponding thermomodule; and suppressing an overcurrent flow to the thermomodule by providing an overcurrent limiting means in a current flow path to the thermomodule.

By the method for driving the semiconductor laser module according to the first aspect, since the overcurrent to the thermomodule can be suppressed by providing the overcurrent limiting means, it is possible to avoid problems resulting from an overcurrent flow to the thermomodule.

Further, by the method for driving the semiconductor according to the second aspect of the invention, which comprises semiconductor laser elements, a thermomodule for adjusting the temperature of the semiconductor laser elements, and optical fibers optically coupled to a laser light emitted from the semiconductor laser elements; the thermomodule is constructed so that the heating action and cooling action are changed in compliance with the orientation of the current flow, the thermomodule is thermally connected to the semiconductor laser element, a bypass path, which short-circuits the upstream side and downstream side of the thermomodule so as to bypass the thermomodule, is provided in a current flow channel by which a current in the heating direction to cause the thermomodule to execute a heating action is caused to flow to the thermomodule, a resistor intervenes in the bypass path, and the current in the heating direction is shunted to the thermomodule and the bypass path to reduce the overcurrent flow in the heating direction of the thermomodule.

By the method for driving the semiconductor laser module according to the second aspect of the invention, the overcurrent in the heating direction is shunted to the thermomodule and the bypass path to reduce the overcurrent flow in the heating direction to the thermomodule. Thereby, as described above, it is possible to prevent various problems resulting from an overcurrent flow in the heating direction to the thermomodule. That is, it is possible to prevent various problems of deterioration in the characteristics of the semiconductor laser elements, optical coupling degradation, optical coupling loss due to lens come-off, and/or breakage of the thermomodule.

As described above, by a semiconductor laser module and a method for driving the semiconductor laser module according to the invention, it is possible to prevent an overcurrent from flowing to the thermomodule when the overcurrent results from an erroneous operation and/or generation of the overcurrent, and, further, various problems resulting from the overcurrent flowing to the thermomodule can be prevented from occurring. Thereby, it is possible to remarkably improve optical coupling of semiconductor laser modules and the reliability of durability.

BRIEF DESCRIPTION OF THE DRAWINGS

These and other objects and advantages of the present invention will become more apparent and more readily appreciated from the following detailed description of the exemplary embodiments of the invention taken in conjunction with the accompanying drawings, in which.

DETAILED DESCRIPTION OF THE PREFERRED EMBODIMENTS

Figure 1:
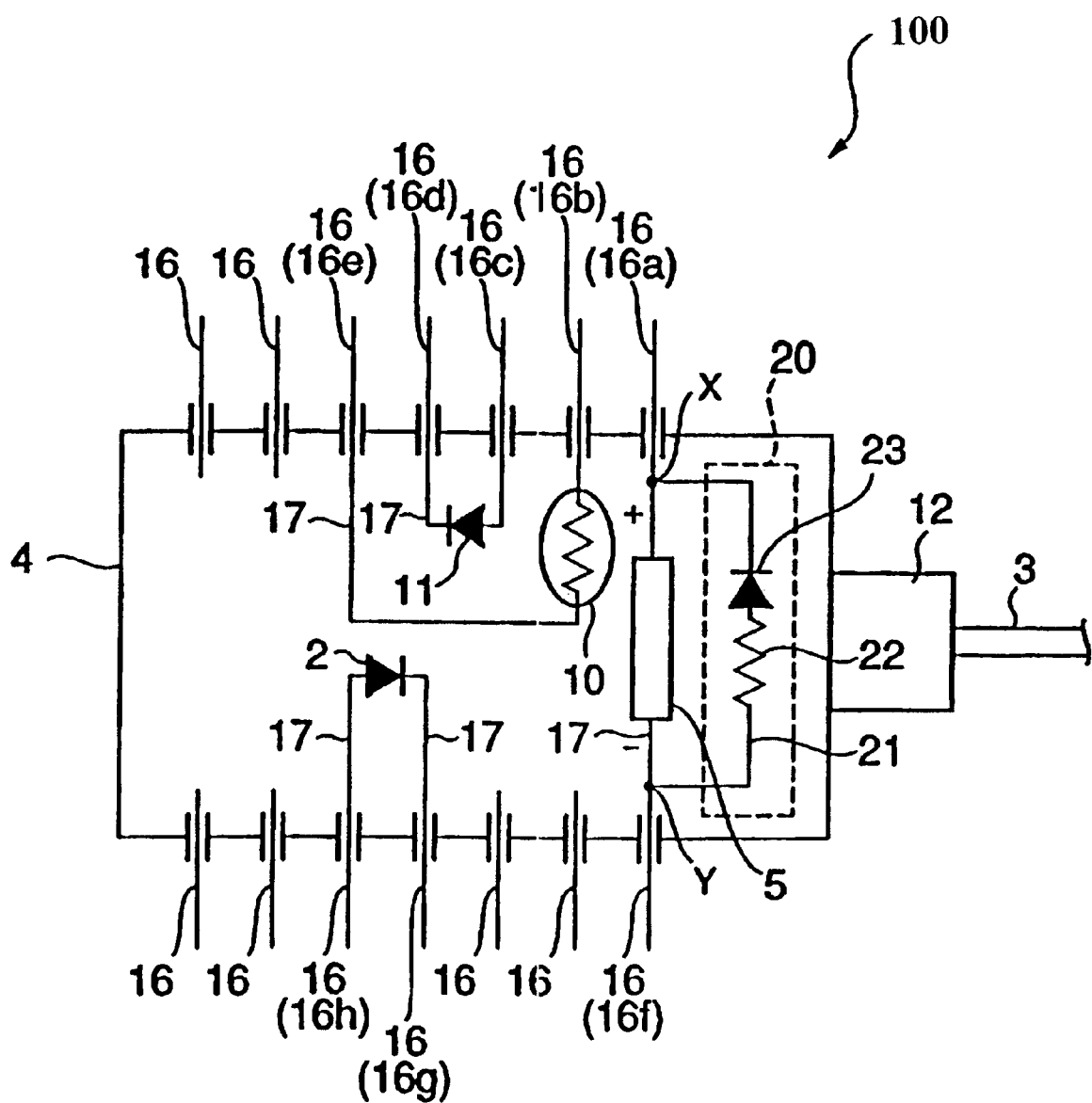
FIG. 1 is a characteristic electrical wiring diagram in a preferred embodiment of a semiconductor laser module and a method for driving the same semiconductor laser module according to the invention.
Figure 6A:
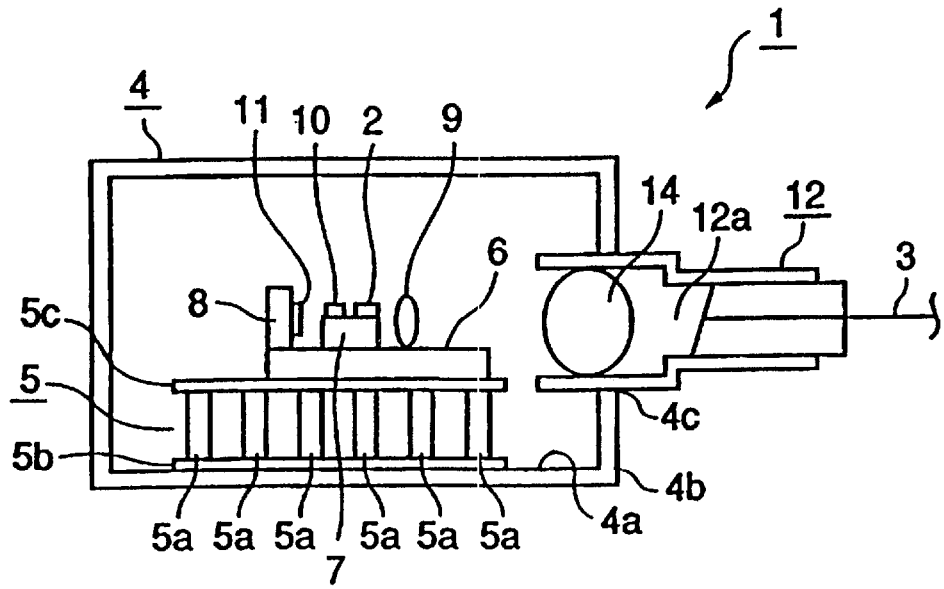
FIG. 6A is an explanatory view showing one structural example of a semiconductor laser module, and, FIG. 6B is an explanatory view showing a prior art electric wiring diagram of a semiconductor laser module.
Figure 6B:
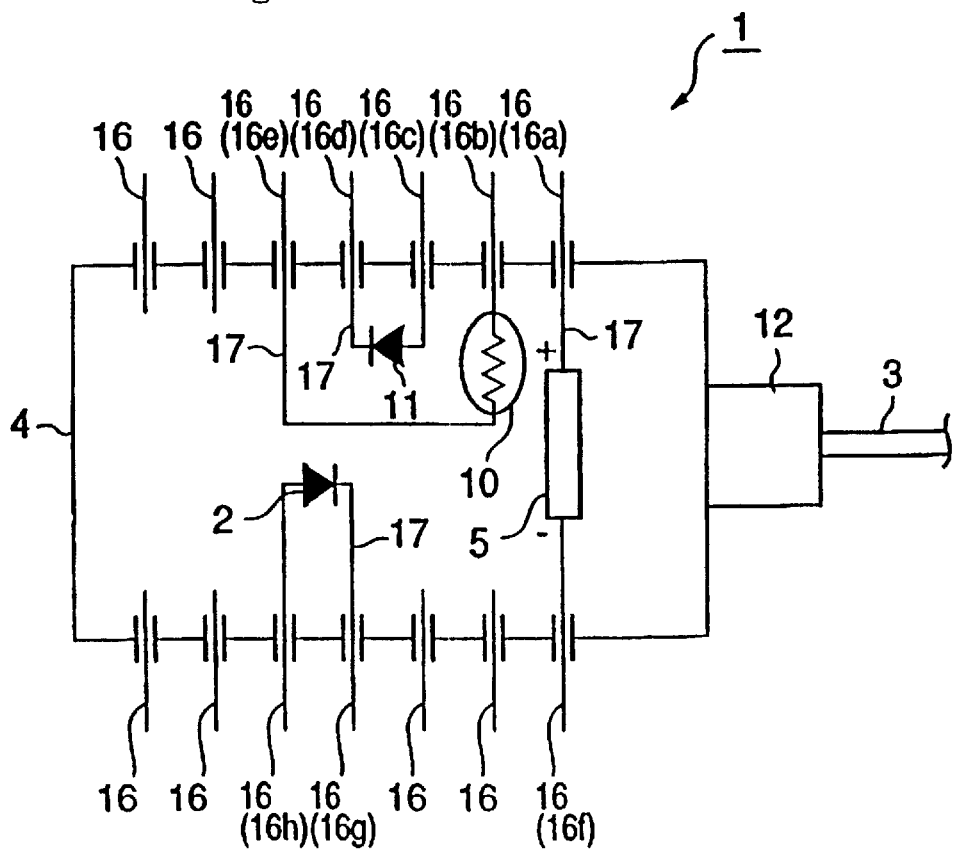

Hereinafter, a description is given of preferred embodiments according to the invention with reference to the accompanying drawings;

FIG. 1 shows a characteristic electric wiring diagram of a first embodiment of a semiconductor laser module according to the invention. A feature of the first embodiment is in that, as shown in FIG. 1, an overcurrent limiting circuit 20 is provided as an overcurrent limiting means. The configuration other than the above is similar to that of the semiconductor laser module illustrated in FIG. 6A and FIG. 6B. In the description of the first embodiment, parts which are the same components as those of the semiconductor laser module illustrated in FIG. 6A and FIG. 6B are given the same reference numbers, and overlapping description thereof is omitted.

There are many cases in which a semiconductor laser module is used in an environment whose temperature is higher than the normal temperature, wherein it is frequently assumed that a thermomodule executes only a cooling action. However, in the first embodiment, an overcurrent limiting circuit 20 described below is provided in a package 4, taking a case into consideration where the thermomodule executes not only a cooling action but also a heating action.

That is, in the first embodiment, the overcurrent limiting circuit 20 is composed of a bypass path 21, a resistor 22, and a diode 23.

In FIG. 1, one end of the bypass path 21 is connected to a point X at the lead pin 16a side from the thermomodule 5, and the other end of the bypass path 21 is connected to a point Y at the lead pin 16f side from the thermomodule 5.

In the first embodiment, where a current flows in a direction orienting from the lead pin 16f to the lead pin 16a, the thermomodule 5 executes a heating action. On the contrary, wherein a current flows in a direction orienting from the lead pin 16a to the lead pin 16f, the thermomodule executes a cooling action. Based thereon, in other words, the bypass path 21 short-circuits the upstream side Y and downstream side X of the thermomodule in a current channel in the heating direction to the thermomodule 5, bypassing the thermomodule 5.

A resistor 22 intervenes in the bypass path 21, and at the same time a diode 23 is provided in series with the resistor 22. The diode 23 intervenes in the bypass path 21, in a state the current direction for heating to cause the thermomodule 5 to execute a heating action is made into a forward direction.

The semiconductor laser module 100 described in the first embodiment is constructed as described above. Hereinafter, a brief description is given of the example of circuit operation of the overcurrent limiting circuit 20. For example, the semiconductor laser module 100 is electrically connected to a drive controlling means for driving the semiconductor laser module, utilizing lead pins 16. Where a current flowing from the lead pin 16a to the lead pin 16f, that is, a current in the cooling direction to render the thermomodule 5 to execute a cooling action is caused to flow, the diode 23 of the overcurrent limiting circuit 20 enters an electrically disconnected state, whereby the current flowing in the cooling direction does not flow into the bypass path 21, but all of the current is caused to flow into the thermomodule 5.

On the contrary, where a current flowing from the lead pin 16f to the lead pin 16a, that is, a current flowing in the heating direction to render the thermomodule 5 to execute a heating action is caused to flow, the diode 23 enters in a continuity ON state, whereby the current flowing in the heating direction is shunted to the thermomodule 5 and bypass path 21 in proportion to the ratio of the resistance value of the thermomodule 5 to that of the resistor 22.

Where an overcurrent flowing in the heating direction is generated, the overcurrent is shunted and is caused to flow into the thermomodule 5 and bypass path 21 as described above, whereby it is possible to reduce the overcurrent flow amount to the thermomodule 5 in comparison with a case where all the overcurrent flows to the thermomodule 5. Further, the resistance value of the resistor 22 may be adequately established in compliance with the specifications.

In the first embodiment, as described above, a substrate (plate member, herein, a plate member 5c) at the side of the thermomodule where the semiconductor laser elements 5 are disposed is thermally isolated from the side wall of a package 4 and the optical fiber supporting member 12. Therefore, when an overcurrent in the heating direction flows into the thermomodule 5, high temperature heat of the thermomodule 5 resulting from the overcurrent is not dissipated to the exterior of the package 4 via the side wall of the package 4 and the optical fiber supporting member 12. Therefore, most of the high temperature heat of the thermomodule 5 originated from the overcurrent flow in the heating direction is transmitted and accumulated in components on the thermomodule 5. Thereby, a rapid temperature rise of the components on the thermomodule 5 occurs, causing various problems.

On the contrary, in the first preferred embodiment, an overcurrent limiting circuit 20 is provided, by which it is devised that the overcurrent in the heating direction to the thermomodule 5 is reduced. Therefore, the following various problems originated from the overcurrent in the heating direction to the thermomodule can be avoided.

That is, it is possible to prevent the thermomodule 5 from abnormal heating originated from the overcurrent in the heating direction, whereby it is possible to prevent the semiconductor elements 2 from being heated to a high temperature. Therefore, an increase in defects in the crystals of the semiconductor laser elements 2 due to high temperature heating can be avoided, whereby it is possible to prevent the semiconductor laser elements from degrading in the characteristics of the semiconductor laser elements 2.

In addition, it is possible to avoid a thermofusion adhesive material such as solder, which connects a substrate 6 for attaching components such as semiconductor laser elements 2, lens 9, etc., and a thermomodule 5, is melted by high temperature heating of the thermomodule 5. Thereby, it is possible to prevent positional deviations of the substrate 6, which originate from the fusion of solder. Therefore, the positional deviations of the semiconductor laser elements 2 and lens 9 with respect to optical fibers 3 are avoided, thereby suppressing generation of optical coupling degradation of the optical fibers 3 and semiconductor laser elements 2. Furthermore, it is possible to prevent the optical output from being lowered.

Still further, it is possible to suppress generation of cracks at the soldered portion between the lens 9 and metallic holder, which originates from a rapid temperature rise of the thermomodule 5. Thereby, it is possible to prevent the lens 9 from coming off, originated from the generation of cracks, and to avoid such a situation where the optical coupling between the semiconductor elements 2 and the optical fibers 3 is disrupted.

Further, since solder fusion between the Peltier elements 5a and the plate members 5b and 5c can be prevented, it is possible to avoid breakage of the thermomodule 5 itself.

As described above, since a characteristic overcurrent limiting circuit 20 is provided in the first embodiment, it is possible to prevent various problems which originate from an overcurrent flow in the heating direction to the thermomodule 5. Therefore, the reliability in the optical coupling and durability of the semiconductor laser module 1 can be remarkably improved.

Figure 2:
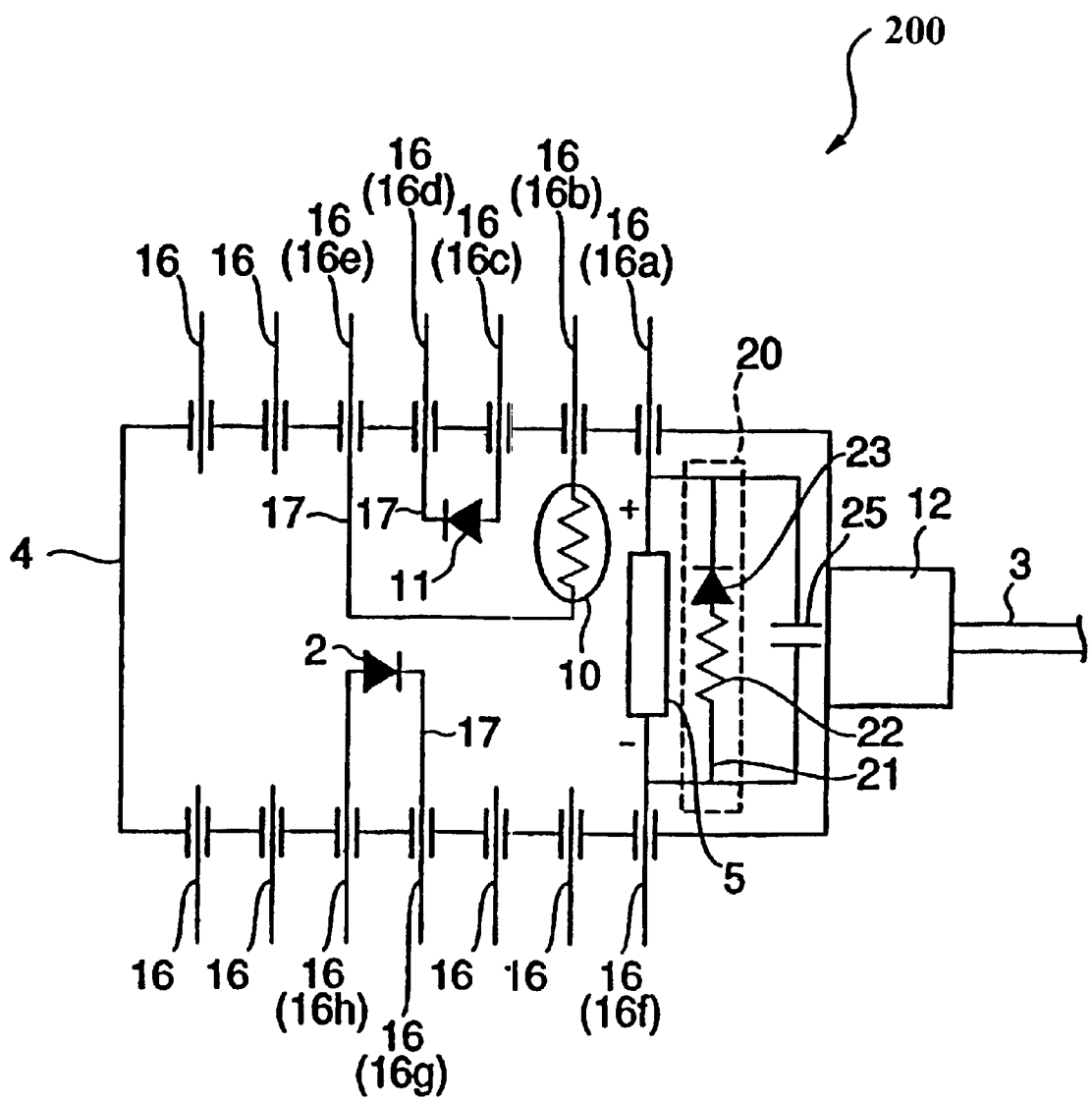
FIG. 2 is a characteristic electrical wiring diagram in another preferred embodiment of a semiconductor laser module and a method for driving the same semiconductor laser module according to the invention.

Hereinafter, a description is given of the second embodiment. A characteristic point in which the second embodiment 200 differs from the first embodiment 100 is, as shown in FIG. 2, in that a capacitor 25 for a surge current flow is provided in parallel to the thermomodule 5. Construction other than that is similar to the first embodiment, wherein, in the description of the second embodiment, parts which are identical to those in the first embodiment are given the same reference numbers, and overlapping description is omitted herein.

In the second embodiment, as described above, the capacitor 25 is provided in parallel to the thermomodule 5. Where a surge current being an instantaneous large current occurs, the surge current flows into the capacitor 25, but almost no surge current flows into the thermomodule 5. Therefore, it is possible to prevent the thermomodule 5 from breakage originated from the surge current flow.

Also, as a surge current flows in the heating direction to the thermomodule 5, components on the thermomodule 5 are subjected to an instantaneous temperature rise, thereby causing various problems as described above. On the contrary, in the second embodiment, as described, it is possible to prevent a surge current from flowing in the heating direction to the thermomodule 5. Accordingly, various problems of degradation in the characteristics of the semiconductor laser elements, a degradation in the optical coupling between the semiconductor laser elements and the optical fibers 3, disruption of the optical coupling originated from the slip of the lens 9, etc., can effectively be prevented.

According to the second embodiment, as in the first embodiment, since the overcurrent limiting circuit 20 is provided, it is possible to suppress an overcurrent flow in the heating direction to the thermomodule 5 by the overcurrent limiting circuit 20 as in the first embodiment. Therefore, various problems which originate from an overcurrent flow in the heating direction can be prevented. Moreover, since the capacitor 25 is provided in parallel to the thermomodule 5, such problems as have originated from the surge current flow can be prevented by the corresponding capacitor 25.

Furthermore, the invention is not limited to the respective embodiments described above. It may be subjected to various modifications in the embodiments. For example, in the respective embodiments, it is assumed that the thermomodule 5 executes not only a cooling action but also a heating cycle, taking a case into consideration where a semiconductor laser module is used in not only an environment whose temperature is greater than a normal level but also in an environment whose temperature is lower than the normal level. On the basis thereof, a resistor 22 intervenes in the bypass path 21 to permit a current to flow in the heating direction to the thermomodule 5. However, for example, the resistor 22 need not be provided only in a case where it is assumed that the semiconductor laser module 1 is used in an environment whose temperature is greater than the normal level, that is, the thermomodule 5 can execute only a cooling action.

In this case, almost all the current in the heating direction flows into the bypass path 21, and almost no current flows into the thermomodule 5, whereby it is possible to securely prevent the overcurrent in the heating direction from flowing into the thermomodule 5, Accordingly, such various problems as described, which originate from an overcurrent flow in the heating direction to the thermomodule 5, can be further securely prevented.

Also, in a case where it is assumed that the thermomodule 5 executes only a cooling action as described above, since it is not necessary for the current in the heating direction to flow into the thermomodule 5, the abovementioned bypass path 21 is not provided, a diode, in which the current flow direction for cooling is made into a forward direction, may be provided in series with the thermomodule 5. That is, such a construction may be employed, where the entire current flow in the heating direction to the thermomodule 5 can be cut.

Figure 3:
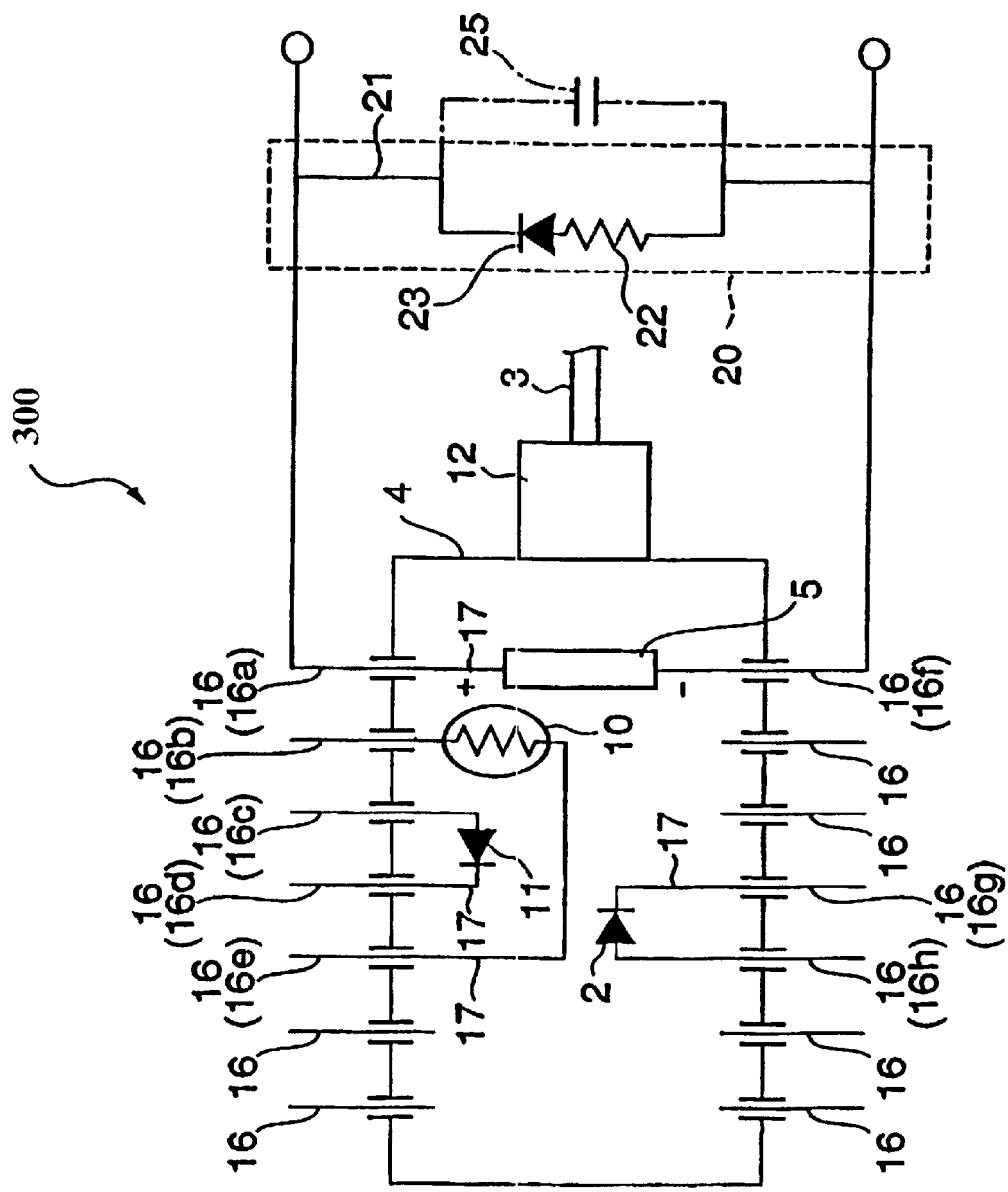
FIG. 3 is an electrical wiring diagram showing still another embodiment of a semiconductor laser module and a method for driving the same semiconductor laser module according to the invention.

In addition, in the respective embodiments, the overcurrent limiting circuit 20 is provided in the package 4, and a semiconductor laser module with an overcurrent-limiting feature is illustrated as an example. However, for example, as shown in FIG. 3, it may be constructed so that an overcurrent limiting circuit 20 as shown by a dashed line in FIG. 3 is provided between the semiconductor laser module having the same construction as that of the prior art and a drive controlling means for the semiconductor laser module to drive the semiconductor laser module 300. The overcurrent limiting circuit 20 is also constructed so as to have a bypass path 21, a resistor 22 and a diode 23 as in the respective embodiments.

Still further, as shown by a chain line in FIG. 3, a capacitor which is similar to that shown in the abovementioned second embodiment may be provided outside the semiconductor laser module 300. The overcurrent limiting circuit 20 and capacitor 25, which are provided outside the semiconductor laser module 1 shown in FIG. 3, can function as in the overcurrent limiting circuit 20 and capacitor 25 illustrated in the respective embodiments, and can bring about the same effects as those in the respective embodiments.

Further, in the respective embodiments, as shown in FIG. 6A, although a coupling optical system is formed by using discrete lenses 9 and 14 separate from the optical fibers 3, the coupling optical system may be formed by using an optical fiber 3 having a lens without the use of the discrete lenses 9 and 14. The optical fiber 3 having a lens is an optical fiber equipped with a lens 3a which is capable of condensing a laser light emitted from the semiconductor laser elements 2.

Figure 4:
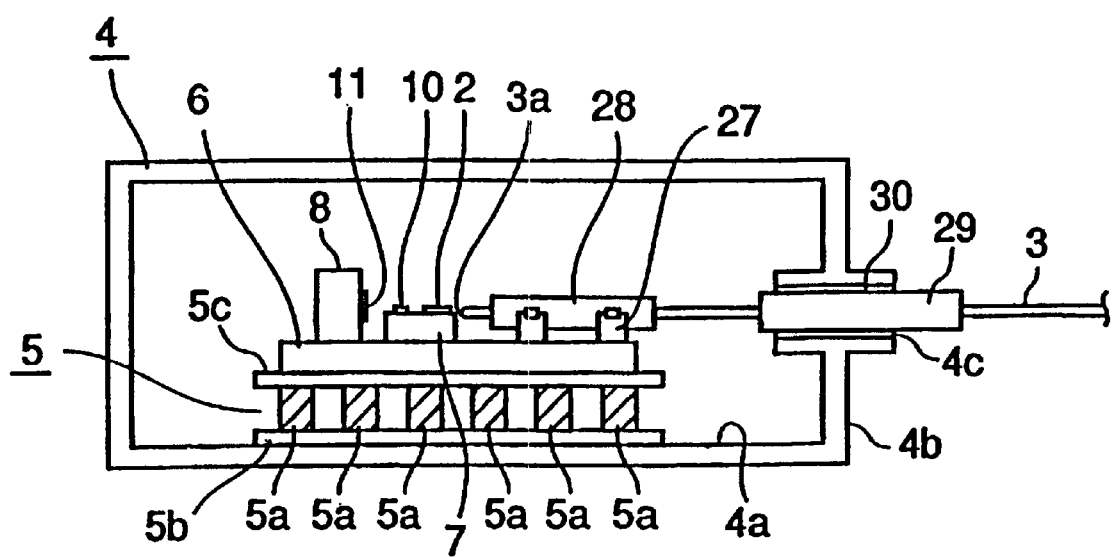
FIG. 4 is an explanatory view showing another structural example of a semiconductor laser module according to the invention.

As shown below, the optical fiber 3 having a lens is incorporated in the semiconductor laser module 1. For example, as shown in FIG. 4, a fixing member (for example, made of stainless steel) is attached to a substrate 6, and an optical fiber supporting member 28 is fixed at the fixing member 27 by, for example, YAG laser welding, etc. In addition, an optical fiber supporting member 29 is inserted into and fitted in a through hole 4c formed at the package 4 and fixed there by a bonding material 30 such as PbSn solder, etc. The optical fiber supporting members 28 and 29 are, respectively, provided with a through hole, through which the optical fiber 3 is introduced from the exterior to the interior of the package 4. The tip end of the optical fiber 3 and the semiconductor laser element 2 are disposed with an adequate interval which enables an optical coupling. Construction other than the above is similar to that shown in FIG. 6A, and overlapping description thereof is omitted herein.

The optical fiber supporting members 28 and 29 are made of, for example, a thermally conductive material such as an Fe—Ni—Co alloy, etc. In the construction shown in FIG. 4, strictly speaking, the plate member 5c of the thermomodule 5 is thermally connected to the optical fiber supporting member 29 by the optical fiber 3. But, since the optical fiber 3 is thin like, for example, 125 mm, the amount of heat which is transmitted from the plate member 5c of the thermomodule 5 to the optical fiber supporting member 29 via the optical fiber 3 are very slight.

Therefore, this is the same if the plate member 5c of the thermomodule 5 is thermally isolated from the optical fiber supporting member 29. That is, in the construction shown in FIG. 4, it is constructed so that heat dissipation-from the plate member 5c of the thermomodule 5 to the exterior of the package 4 via the abovementioned optical fiber supporting member 29 is limited. In such a construction, where the thermomodule 5 is heated to an abnormally high temperature, resulting from an overcurrent flow to the thermomodule 5, almost all of the heat of the high temperature is transmitted to and accumulated in the components on the thermomodule 5 as described above, whereby various problems arise since the components on the thermomodule 5 are subjected to a rapid temperature rise. On the contrary, by providing such a construction as can suppress an overcurrent flow to the thermomodule as in the respective embodiments, it is possible to prevent the problems originated from the overcurrent flow to the thermomodule 5, whereby such a construction is very effective.

Figure 5:
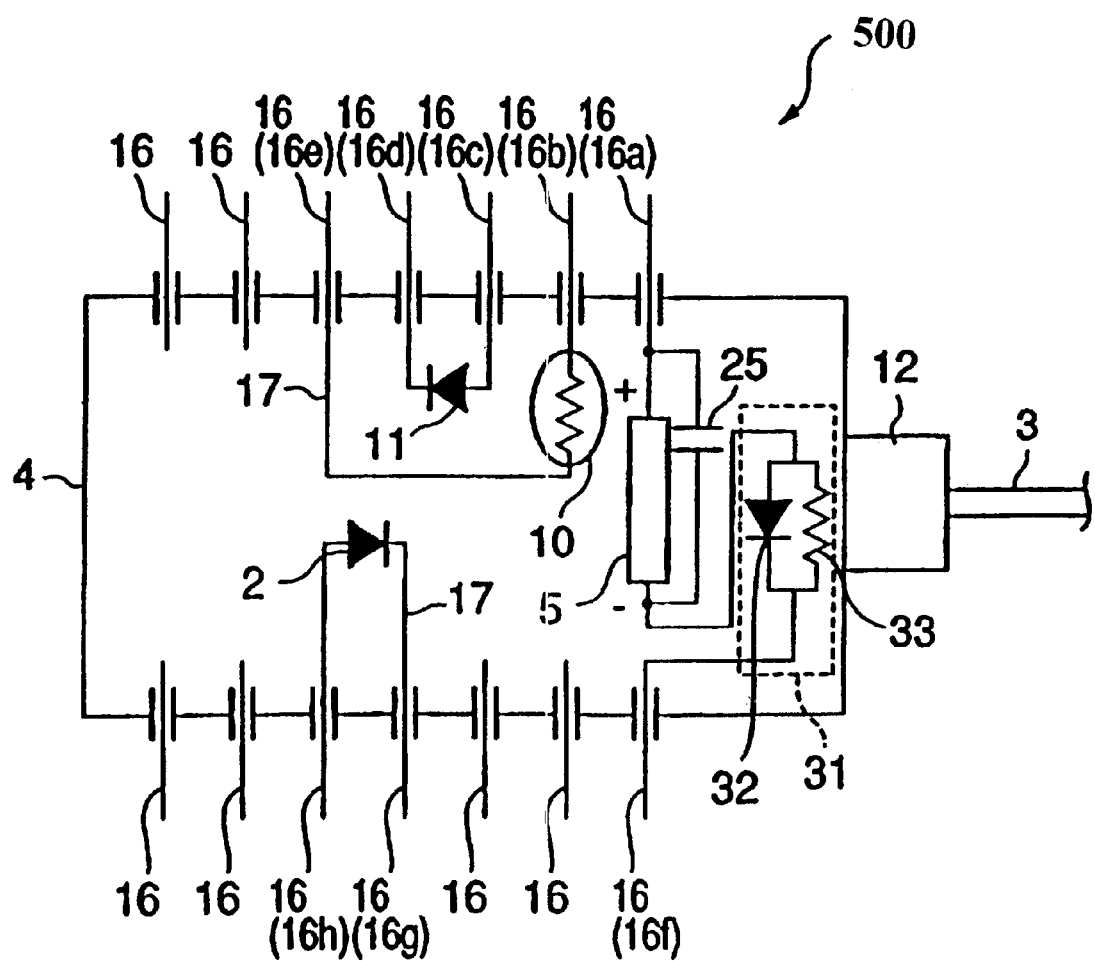
FIG. 5 is a characteristic electrical wiring diagram of still another embodiment of a semiconductor laser module and a method for driving the same semiconductor laser module according to the invention.

In addition, such a construction as shown in FIG. 5 may be employed as still another embodiment of the invention. The example illustrated in FIG. 5 is such that the thermomodule 5 is not controlled by a current but by voltage, which is capable of avoiding generation of problems originated from overvoltage application onto the thermomodule 5. That is, in FIG. 5, an overvoltage limiting means 31 is provided in series with the thermomodule 5. The overvoltage limiting means 31 is constructed of a parallel connection body of a diode 32, in which the current flow direction in the cooling direction is made into a forward direction, and a resistor 38.

In the construction shown in FIG. 5, where voltage in the cooling direction is applied to the thermomodule 5, the diode 32 is in a continuity ON state. Therefore, the current scarcely flows into the resistor 32, but most of the current flows into the diode 32. Therefore, almost all the voltage applied between the lead pins 16a and 16f is applied to the thermomodule 5.

On the contrary, where voltage in the heating direction is applied to the thermomodule 5, the diode is in a continuity OFF state. Accordingly, since the current flows into the resistor 33, the voltage applied between the lead pins 16a and 16f is shunted to and applied to the thermomodule 5 and resistor 33. On the basis thereof, when overvoltage is generated between the lead pins 16a and 16f, the overvoltage is shunted to and applied to the thermomodule 5 and resistor 33. Therefore, it is possible to reduce the overvoltage application onto the thermomodule 5, and various problems originated from overvoltage application on the thermomodule 5 can be prevented.

Also, such an overvoltage limiting control and such an overcurrent limiting means as illustrated in the respective embodiments may be both provided.

What is claimed is:

1. A semiconductor laser module comprising:
   semiconductor laser elements;
   a thermomodule for adjusting the temperature of the semiconductor laser elements; and
   an optical fiber optically coupled to a laser light emitted from the semiconductor laser elements;
   wherein said thermomodule is constructed so that it variably adjusts the temperature of the semiconductor laser elements in compliance with an amount of a current flowing into said thermomodule; and,
   an overcurrent limiting circuit connected in parallel to the thermomodule to prevent an overcurrent from flowing into said thermomodule.

2. A semiconductor laser module as set forth in claim 1, wherein the thermomodule is constructed so as to change a heating action and a cooling action in compliance with the orientation of a current flow; and said overcurrent limiting means is provided in a current flow channel which causes a current in the heating direction, which heats said thermomodule, to flow into the thermomodule.

3. A semiconductor laser module as set forth in claim 1, wherein
   a bypass path, which short-circuits the upstream side and downstream side of a thermomodule, bypassing the thermomodule, is provided in a current flow channel which causes a current in the heating direction to flow into the thermomodule;
   a resistor intervenes in said bypass path, and at the same time, a diode in which the current direction for heating is made into a forward direction, is provided in series with said resistor;
   said bypass path, resistor, and diode shunt and supply a current in the heating direction to the thermomodule and bypass path and constitute an overcurrent limiting means for reducing the flow of an overcurrent in the heating direction to the thermomodule.

4. A semiconductor laser module as set forth in claim 1, wherein the thermomodule is constructed so that Peltier elements are placed between a first substrate and a second substrate;
   semiconductor laser elements are disposed on either said first substrate or second substrate, are thermally connected to the thermomodule, and have a lens which condenses a laser light emitted from the semiconductor elements and introduces the laser light into optical fibers; and
   said lens is thermally connected to the substrate of the thermomodule at the side where the semiconductor laser elements are disposed, via a thermal fusion connection material which fixes an attaching member of said lens.

5. A semiconductor laser module as set forth in claim 2, wherein the thermomodule is constructed so that Peltier elements are placed between a first substrate and a second substrate;

semiconductor laser elements are disposed on either said first substrate or second substrate, are thermally connected to the thermomodule, and have a lens which condenses a laser light emitted from the semiconductor elements and introduces the laser light into optical fibers; and said lens is thermally connected to the substrate of the thermomodule at the side where the semiconductor laser elements are disposed, via a thermal fusion connection material which fixes an attaching member of said lens.

6. A semiconductor laser module as set forth in claim 3, wherein the thermomodule is constructed so that Peltier elements are placed between a first substrate and a second substrate;

semiconductor laser elements are disposed on either said first substrate or second substrate, are thermally connected to the thermomodule, and have a lens which condenses a laser light emitted from the semiconductor elements and introduces the laser light into optical fibers; and said lens is thermally connected to the substrate of the thermomodule at the side where the semiconductor laser elements are disposed, via a thermal fusion connection material which fixes an attaching member of said lens.

7. A semiconductor laser module as set forth in claim 1, wherein the optical fiber is an optical fiber having a lens, in which a lens for condensing a laser light emitted from the semiconductor laser elements is formed at the end portion into which the laser light is made incident.

8. A semiconductor laser module as set forth in claim 2, wherein the optical fiber is an optical fiber having a lens, in which a lens for condensing a laser light emitted from the semiconductor laser elements is formed at the end portion into which the laser light is made incident.

9. A semiconductor laser module as set forth in claim 3, wherein the optical fiber is an optical fiber having a lens, in which a lens for condensing a laser light emitted from the semiconductor laser elements is formed at the end portion into which the laser light is made incident.

10. A semiconductor laser module as set forth in claim 1, wherein the thermomodule is provided with a construction in which Peltier elements are placed between a first substrate and a second substrate; and semiconductor laser elements are disposed on either said first substrate or second substrate, and are thermally connected to the thermomodule;

said semiconductor laser elements and thermomodule are disposed and accommodated in a package;

said package is provided with a through hole passing from the interior of the package to the exterior thereof;

an optical fiber supporting member consisting of a thermally conductive material is inserted and fitted in said through hole;

an end portion side of the optical fiber is introduced from the exterior of the package to the interior thereof through an insertion hole formed at the optical fiber supporting member;

the substrate of the thermomodule at the side where the semiconductor laser elements are disposed is thermally isolated from said optical fiber supporting member; and dissipation n of heat from the substrate of the thermomodule at the side where the semiconductor laser elements are disposed, to the exterior of the package via said optical fiber is limited.

11. A semiconductor laser module as set forth in claim 2, wherein the thermomodule is provided with a construction in which Peltier elements are placed between a first substrate and a second substrate; and semiconductor laser elements are disposed on either said first substrate or second substrate, and are thermally connected to the thermomodule;

said semiconductor laser elements and thermomodule are disposed and accommodated in a package;

said package is provided with a through hole passing from the interior of the package to the exterior thereof;

an optical fiber supporting member consisting of a thermally conductive material is inserted and fitted in said through hole;

an end portion side of the optical fiber is introduced from the exterior of the package to the interior thereof through an insertion hole formed at the optical fiber supporting member;

the substrate of the thermomodule at the side where the semiconductor laser elements are disposed is thermally isolated from said optical fiber supporting member; and dissipation of heat from the substrate of the thermomodule at the side where the semiconductor laser elements are disposed, to the exterior of the package via said optical fiber is limited.

12. A semiconductor laser module as set forth in claim 3, wherein the thermomodule is provided with a construction in which Peltier elements are placed between a first substrate and a second substrate; and semiconductor laser elements are disposed on either said first substrate or second substrate, and are thermally connected to the thermomodule;

said semiconductor laser elements and thermomodule are disposed and accommodated in a package;

said package is provided with a through hole passing from the interior of the package to the exterior thereof;

an optical fiber supporting member consisting of a thermally conductive material is inserted and fitted in said through hole;

an end portion side of the optical fiber is introduced from the exterior of the package to the interior thereof through an insertion hole formed at the optical fiber supporting member;

the substrate of the thermomodule at the side where the semiconductor laser elements are disposed is thermally isolated from said optical fiber supporting member; and dissipation of heat from the substrate of the thermomodule at the side where the semiconductor laser elements are disposed, to the exterior of the package via said optical fiber is limited.

13. A semiconductor laser module as set forth in claim 4, wherein the thermomodule is provided with a construction in which Peltier elements are placed between a first substrate and a second substrate; and semiconductor laser elements are disposed on either said first substrate or second substrate, and are thermally connected to the thermomodule;

said semiconductor laser elements and thermomodule are disposed and accommodated in a package;

said package is provided with a through hole passing from the interior of the package to the exterior thereof;

an optical fiber supporting member consisting of a thermally conductive material is inserted and fitted in said through hole;

an end portion side of the optical fiber is introduced from the exterior of the package to the interior thereof through an insertion hole formed at the optical fiber supporting member;

the substrate of the thermomodule at the side where the semiconductor laser elements are disposed is thermally isolated from said optical fiber supporting member; and dissipation of heat from the substrate of the thermomodule at the side where the semiconductor laser elements are disposed, to the exterior of the package via said optical fiber is limited.

14. A semiconductor laser module as set forth in claim 5, wherein the thermomodule is provided with a construction in which Peltier elements are placed between a first substrate and a second substrate; and semiconductor laser elements are disposed on either said first substrate or second substrate, and are thermally connected to the thermomodule;

said semiconductor laser elements and thermomodule are disposed and accommodated in a package;

said package is provided with a through hole passing from the interior of the package to the exterior thereof;

an optical fiber supporting member consisting of a thermally conductive material is inserted and fitted in said through hole;

an end portion side of the optical fiber is introduced from the exterior of the package to the interior thereof through an insertion hole formed at the optical fiber supporting member;

the substrate of the thermomodule at the side where the semiconductor laser elements are disposed is thermally isolated from said optical fiber supporting member; and dissipation of heat from the substrate of the thermomodule at the side where the semiconductor laser elements are disposed, to the exterior of the package via said optical fiber is limited.

15. A method for driving a semiconductor laser module, which thermally connects a thermomodule to semiconductor laser elements, having semiconductor laser elements, a thermomodule for adjusting the temperature of the semiconductor laser element, and an optical fiber optically coupled with a laser light emitted from said semiconductor laser element; comprising the steps of:

adjusting the temperature of the semiconductor laser elements in compliance with the amount of current passing into the thermomodule; and suppressing an overcurrent flow to the thermomodule by providing an overcurrent limiting circuit connected in parallel to the thermomodule.

16. A method for driving a semiconductor laser module having semiconductor laser elements, a thermomodule for adjusting the temperature of the semiconductor laser elements, and an optical fiber optically coupled with a laser light emitted from said semiconductor laser elements; comprising the steps of:

constructing said thermomodule so that it changes a heating action and a cooling action in compliance with the orientation of a current flow;

thermally connecting said thermomodule to the semiconductor laser elements;

providing a bypass path, which bypasses the upstream side and the downstream side of the thermomodule and short-circuits the thermomodule, in a current flow channel for causing a current in the heating direction, which executes a heating action of the thermomodule, to flow into the thermomodule;

causing a resistor to intervene in said bypass path; and shunting the current in the heating direction to the thermomodule and bypass circuit in order to reduce the overcurrent flow in the heating direction to the thermomodule.

* * * * *